United States Patent [19]

Barkanic et al.

[11] Patent Number: 4,787,957
[45] Date of Patent: Nov. 29, 1988

[54] DESMEAR AND ETCHBACK USING NF$_3$/O$_2$ GAS MIXTURES

[75] Inventors: John A. Barkanic, Schnecksville; Donna M. Reynolds, Pottsville, both of Pa.

[73] Assignee: Air Products and Chemicals, Inc., Allentown, Pa.

[21] Appl. No.: 101,222

[22] Filed: Sep. 25, 1987

[51] Int. Cl.$^4$ ............... C09K 13/08; B29C 37/00
[52] U.S. Cl. ................... 156/643; 156/646; 156/668; 156/902; 252/79.3
[58] Field of Search ............ 156/643, 646, 668, 902; 252/79.3

[56] References Cited

U.S. PATENT DOCUMENTS

| | | | |
|---|---|---|---|
| Re. 30,505 | 2/1981 | Jacob | 156/643 |
| 3,930,913 | 1/1976 | Jacob | 156/8 |
| 4,310,380 | 1/1982 | Flamm et al. | 156/643 |
| 4,328,081 | 5/1982 | Fazlin | 204/192 |
| 4,374,698 | 2/1983 | Sanders et al. | 156/643 |
| 4,425,210 | 1/1984 | Fazlin | 204/19 |
| 4,470,871 | 9/1984 | White et al. | 156/668 |
| 4,473,437 | 9/1984 | Higashikawa et al. | 156/643 |
| 4,496,420 | 1/1985 | Frehlich et al. | 156/643 |
| 4,522,681 | 6/1985 | Gorowitz et al. | 156/643 |
| 4,523,975 | 6/1985 | Groves et al. | 156/668 |
| 4,568,410 | 2/1986 | Thornquist | 156/643 |
| 4,654,115 | 3/1987 | Egitto et al. | 156/902 |
| 4,692,205 | 9/1987 | Sachdev et al. | 156/668 |
| 4,702,792 | 10/1987 | Chow et al. | 156/668 |

Primary Examiner—David L. Lacey
Assistant Examiner—Lori-Ann Johnson
Attorney, Agent, or Firm—Geoffrey L. Chase; William F. Marsh; James C. Simmons

[57] ABSTRACT

The present invention is directed to a method for plasma desmear and etchback of epoxy and polyimide materials from a multilayered or double sided printed circuit board using a plasma gas composition in the range of 20–45% NF$_3$, the remainder being O$_2$.

6 Claims, 1 Drawing Sheet

ETCHING EPOXY COUPONS at 0.25 WATTS/CM$^2$ of POWER

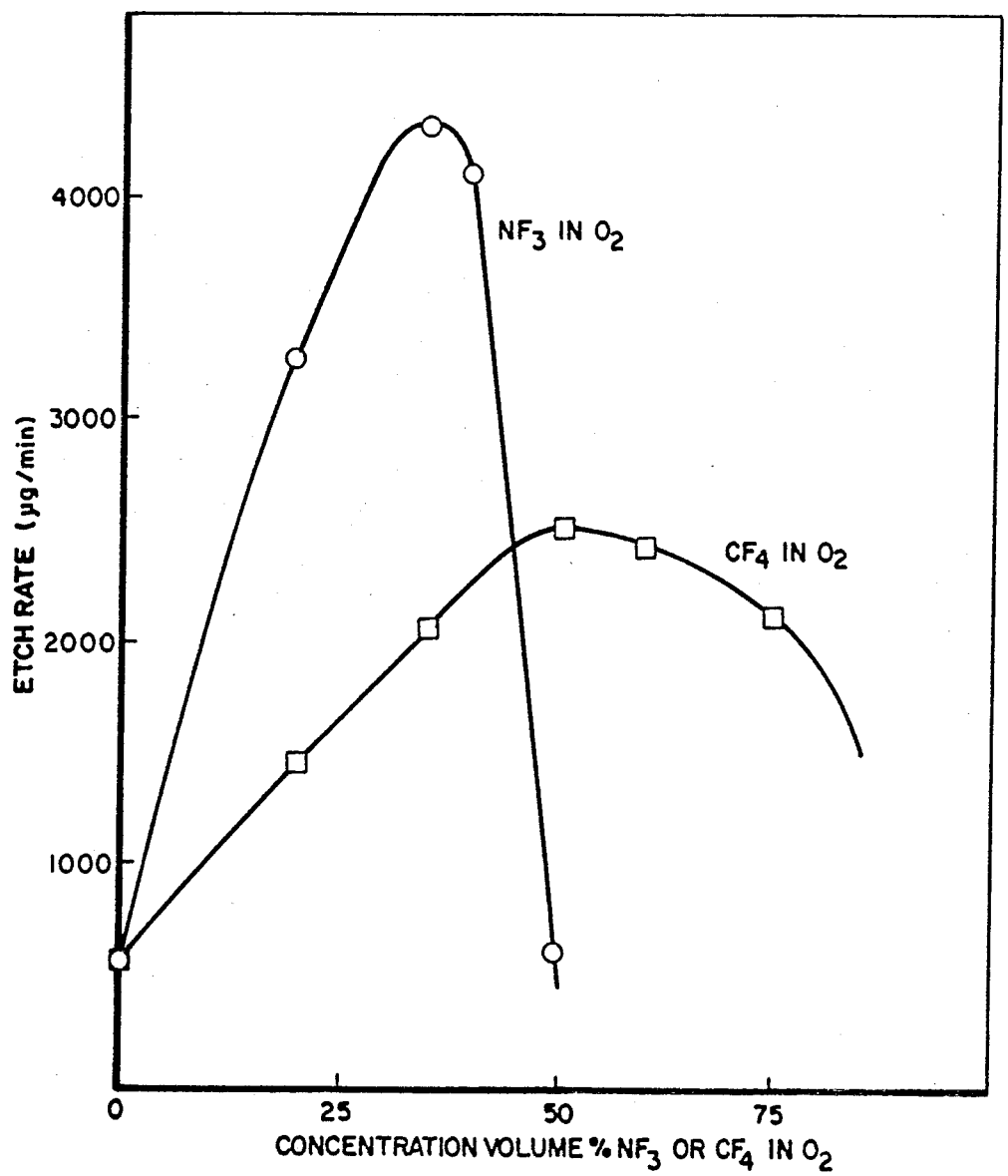

DESMEAR AND ETCHBACK USING NF$_3$/O$_2$ GAS MIXTURES

TECHNICAL FIELD

The present invention is directed to the preparation and clean-up of printed circuit boards wherein multiple layers are laminated with polymer such as epoxy or polyimide polymer. More specifically the present invention is directed to plasma desmearing and etchback of epoxy or polyimide using a gas mixture of NF$_3$ and O$_2$.

BACKGROUND OF THE PRIOR ART

Desmearing and etchback are known technologies wherein both wet chemical and plasma techniques are practiced in the board fabrication industry.

U.S. Pat. No. 4,328,081 describes a particular chamber configuration for accomplishing plasma desmearing. The preferred plasma for accomplishing the desmearing in this patent is recited at column 2, line 46 as being oxygen and carbon tetrafluoride.

U.S. Pat. No. 4,425,210 discloses a multiple electrode set configuration for plasma desmearing of printed circuit boards or multiple layered printed wire boards. Again, at column 2, line 46, the selected plasma is comprised of oxygen and carbon tetrafluoride.

U.S. Pat. No. 4,496,420 discloses a method for desmearing multilayered laminated printed circuit boards using an apertured plate in conjunction with plasma desmearing. Appropriate board compositions includes acrylic, polyimide, Kapton, Kevlar and epoxy. All of these materials are known to smear during processing, most notably in drilling holes through printed circuit boards for subsequent electrical contact or assembly.

U.S. Pat. No. 30,505 discloses a process for plasma etching of a solid material with a binary mixture comprising essentially oxygen and a halocarbon wherein at least one carbon atom in said molecule is linked to a predominance of fluorine atoms.

U.S. Pat. No. 3,930,913 discloses a method for removing a patterned layer of organic material from a metallic sublayer wherein a plasma comprising a mixture of oxygen and nitrogen is used to remove the organic material. Both the oxygen and the nitrogen are present in their uncombined elemental form.

U.S. Pat. No. 4,310,380 discloses a dry plasma etch process for silicon surfaces using a gas composition wherein the compounds of the gaseous composition are selected from the group consisting of chlorine trifluoride, nitrogen trifluoride, bromine trifluoride and iodine trifluoride.

U.S. Pat. No. 4,374,698 describes an etch process for differential etching of silicon nitride from silicon dioxide using the combination of carbon tetrafluoride and a halofluorocarbon. The gas etchant may include oxygen or nitrous oxide.

U.S. Pat. No. 4,473,437 discloses a process for etching organic material layers using a dry plasma of oxygen and nitrogen-containing mixtures.

U.S. Pat. No. 4,522,681 discloses a method for etching holes in silicon dioxide wherein a dry plasma etch gas of argon, nitrogen trifluoride and oxygen may be used. Polymeric photoresist materials such as polymethyl methacrylate, ethyl methacrylate, methyl isopropyl ketone as well as copolymers thereof with metacrylic acid may be used. This class of photoresist materials was required, versus standard novel AC photoresists, to successfully practice the invention.

U.S. Pat. No. 4,568,410 discloses a dry plasma etch process for etching silicon nitride using nitrogen trifluoride and oxygen. Good results for etching silicon nitride were found with relative percentages of the nitrogen trifluoride to oxygen recited at column 5, line 65 to be 10–20 SCCM of NF$_3$ in comparison to 20–35 SCCM for oxygen. The gases are also discloses as capable of etching common resists.

SUMMARY OF THE INVENTION

The present invention is directed to a method for desmearing or etchback of printed circuit boards using a plasma gas medium produced between a pair of electrodes in an evacuated chamber wherein the material being desmeared or etched is selected from the group consisting of epoxy and polyimide, the improvement comprising desmearing or etching back with a plasma comprising gas mixture of 20–50% NF$_3$, the remainder being O$_2$.

Preferably, the plasma etch chamber is evacuated to a pressure in the range of 1000–3000 milli-Torr.

Preferably, the power density used to create the plasma is in the range of 0.08–0.25 watt/cm$^2$ of electrode surface.

Optimally, the material being desmeared from the printed circuit board is epoxy.

Preferably, the temperature of the plasma is in the range of 80°–140° C., optimally approximately 100° C.

Optimally, the plasma gas mixture comprises 25–40% NF$_3$, the remainder being O$_2$.

BRIEF DESCRIPTION OF THE DRAWING

The drawing is a graphical representation of the relative etch rates of a plasma of NF$_3$ in O$_2$ in comparison to CF$_4$ in O$_2$.

DETAILED DESCRIPTION OF THE INVENTION

Double sided and multilayered printed circuit boards or multilayered printed wiring boards, hereinafter both referred to as printed circuit boards, are the common substrate for many microelectronic circuit devices. During fabrication, printed circuit boards are drilled and cut for electrical connections and physical fit and interconnection. During the drilling and cutting operation the polymer material of the boards is smeared across potential electrical connections. In the past this problem has been resolved by resource to wet chemical etching techniques. However these wet chemical techniques have had severe drawbacks and have lost favor to dry plasma etching. Plasma desmear and etchback is a technique utilizing active gases which are applied to organic surfaces such as epoxy and more specifically in the hole of the printed wiring board or circuit board resulting in a chemical reaction which cleans the hole of unwanted polymeric or epoxy debris. The reactant products are volatile and are pumped away through a vacuum system in the plasma etch or desmear processing chamber.

Desmearing is necessary to clear away the results of initial smearing. Smear in a through hole in a printed circuit board is defined as the presence of an insulative or foreign material or combination of both over the conductive inner circuit which if not removed cause poor electrical and mechanical interconnect after the electroless deposition of copper in the hole of a printed circuit board. Plasma etchback involves exposing the polymer to the reactive plasma for a longer period of time thereby recessing the polymer from the conductive inner layer. As used herein the term "desmearing" will be used for both traditional desmearing and etchback. Smear forms primarily during the drilling operation in fabricating printed circuit boards. The possibilities of smear arise from improper lamination cycles causing resin curing problems and resulting in soft spots on the boards. There can also be substandard resin characteristics leading to smear. Smear can also form if the drill performing the drilling operation is dull or has incorrect geometry. The speed, feed rate and back-up material, if incorrect, can also cause smear. Smear can also occur if the hole size to pad dimension and distance between the holes is not properly designed. Technological advances in drilling and lamination have reduced the quantity of smear, but it is still virtually impossible to produce smear-free holes economically in production quantities of printed wiring boards and printed circuit boards.

Recently it has been demonstrated that the use of plasma technology can be applied to removing smear instead of the prior art wet chemical process. Plasma desmearing results in better uniformity throughout the matrix of the board. Plasma is defined as matter in an elevated energy state. Physical properties of matter in the plasma state are somewhat similar to those in the gaseous state. The flow patterns and characteristics become extremely aggressive in the plasma state where the gases are essentially in a nascent form. Plasma or active species are created in a region between the pair of radio frequency powered electrodes and are then directed toward the target surface, which in the subject of the present invention, are typically holes in printed circuit boards.

Plasma desmearing of printed circuit boards has typically been performed using oxygen and carbon tetrafluoride. When a mixture of these gases passes through the RF electrodes in a vacuum, the active species formed are said to be nascent oxygen and atomic fluorine. These active species react with the polymer in the holes of the printed circuit board to form volatile products which are subsequently removed by exhausting.

The desmearing process using plasma basically requires a chamber, a vacuum pump, a source of RF energy and metered gases. The chamber must withstand the vacuum but more importantly it must accommodate the printed circuit board so that the proper directional flow of the active species of the plasma is possible and so that there is an even flow of these species throughout the matrix of boards to achieve uniform results. Such plasma desmearing apparatus and processing is set forth in greater detail in U.S. Pat. No. 4,328,081, issued May 4, 1982. This patent is hereby incorporated herein by reference.

The present inventors have ascertained that $NF_3$ in the presence of $O_2$ provides decidedly superior desmearing effects for epoxy and polyimide smear than the prior art plasma of $CF_4$ in $O_2$. More particularly, the present invention has found that a decided advantage is achieved when using a 20–50% $NF_3$, the remainder being $O_2$, or optimally 25–40% $NF_3$, the remainder being $O_2$ to desmear epoxy printed circuit board smear. The combination of nitrogen trifluoride and oxygen has not been utilized for plasma desmearing and etchback technology in the past. Nitrogen trifluoride and oxygen has been known for etching of silicon-containing integrated circuits. During such silicon etching, the prior art has recognized that photoresist is also etched by nitrogen trifluoride and oxygen. However, the characteristics of etch between photopolymers and epoxy and polyimide polymers are decidedly different, such that the etch rates for photoresist polymers would not have disclosed to the desmearing industry that etch characteristics would be sufficient in desmear operations using a gas mixture other than the prior art carbon tetrafluoride and oxygen.

As shown in the drawing, the present inventors have discovered a significant enhancement in desmearing operations over a broad concentration range of nitrogen trifluoride in oxygen in contrast to the prior art carbon tetrafluoride in oxygen. The respective curves in the drawing were accomplished at 0.25 watts/cm² power density on epoxy coupons having a general size of 1 by 1 in² dimension. The Y axis etch rate is in micrograms per minute of material removed while the X axis concentration is in percent $NF_3$ or $CF_4$ in oxygen. The drawing dramatically shows the enhancement in desmearing rate for epoxy when using $NF_3$ in oxygen rather than carbon tetrafluoride in oxygen. Specifically, a maximum occurs broadly at 20–50% $NF_3$ and more specifically at 25–40% $NF_3$.

This decided advantage of $NF_3$ and oxygen for desmearing epoxy or polyimide could not be extrapolated from the prior art teachings of using $NF_3$ and oxygen for silicon etches even wherein photoresist was known to be etched because of the significant difference in the etch characteristics of traditional polymeric photoresist and the epoxy substrates from which printed circuit boards are fabricated.

In Table I below, the significant differential in etch rates for both $NF_3$ in oxygen and $CF_4$ in oxygen is demonstrated at a power density of 0.25 w/cm² with regard to microelectronic photoresist polymer and the epoxy polymer comprising printed circuit board material generally sought to be desmeared in printed circuit board fabrication techniques.

TABLE I

| | Etch Rates (μgm/min) | |
|---|---|---|
| Gas Composition | Microelectronics Photo-polymer | Epoxy Polymer |
| 35% $NF_3$/65% $O_2$ | 158 | 4287 |
| 50% $NF_3$/50% $O_2$ | 80 | 646 |
| 35% $CF_4$/65% $O_2$ | 60 | 2046 |
| 50% $CF_4$/50% $O_2$ | 74 | 2524 |

It is clear the prior art experience in etching photoresist would not have demonstrated the significant optimal effect of desmearing that $NF_3$ and oxygen produces when desmearing epoxy or similar materials of printed circuit boards such as polyimides. Specifically, the unusual activity of a 35% $NF_3$/65% oxygen plasma gas mixture on epoxy polymer wherein an etch rate maximum of 4287 μgm/min was achieved would not have been suggested by the prior history of carbon tetrafluoride oxygen mixtures or the silicon etching of nitrogen trifluoride and oxygen. The table shows $NF_3$ in oxygen has generally similarly low activity on photoresist polymer as does carbon tetrafluoride in oxygen.

The process of the patent has been set forth with regard to specific preferred embodiments however it is appreciated those skilled in the art may contemplate other aspects of the invention whose scope should be ascertained from the claims which follow:

We claim:

1. In a method for desmearing printed circuit boards using a plasma gas desmearing medium produced between a pair of electrodes in an evacuated chamber wherein the material being desmeared is selected from the group consisting of epoxy and polyimide, the improvement comprising desmearing with a plasma comprising a gas mixture of 20–45% $NF_3$ the remainder being $O_2$ wherein the chamber is evacuated to a pressure in the range of 1000 to 3000 milli-Torr, and wherein the power density used to create the plasma is in the range of 0.08 to 0.25 wat/cm$^2$.

2. The method of claim 1 wherein the material being desmeared is epoxy.

3. The method of claim 1 wherein the temperature of the plasma is in the range of 80°–140° C.

4. The method of claim 1 wherein the temperature of the plasma is approximately 100° C.

5. The method of claim 1 wherein the gas mixture comprises 25 to 40% $NF_3$ the remainder being $O_2$.

6. The method of claim 1 wherein the gas mixture comprises approximately 35% $NF_3$ and 65% $O_2$.

* * * * *